United States Patent
Ronner et al.

(10) Patent No.: US 12,412,759 B2
(45) Date of Patent: Sep. 9, 2025

(54) SUBSTRATE PROCESSING APPARATUS, REACTOR MOVER FOR MOVING A REACTOR OF THE APPARATUS AND METHOD OF MAINTAINING THE REACTOR OF THE APPARATUS

(71) Applicant: ASM IP Holding B.V., Almere (NL)

(72) Inventors: Gijsbert Hendrik Ronner, Hilversum (NL); Christianus G. M. de Ridder, Hoogland (NL); Theodorus G. M. Oosterlaken, Oudewater (NL); Klaas P. Boonstra, Almere (NL); Jeroen de Jonge, Almere (NL); Lucian Jdira, Nieuw Vennep (NL); Chaggai Shmuel Ganani, Almere (NL)

(73) Assignee: ASM IP Holding B.V., Almere (NL)

( * ) Notice: Subject to any disclaimer, the term of this patent is extended or adjusted under 35 U.S.C. 154(b) by 134 days.

(21) Appl. No.: 17/336,494

(22) Filed: Jun. 2, 2021

(65) Prior Publication Data
US 2021/0384046 A1    Dec. 9, 2021

Related U.S. Application Data

(60) Provisional application No. 63/035,208, filed on Jun. 5, 2020.

(51) Int. Cl.
*H01L 21/67* (2006.01)
*B65G 47/90* (2006.01)

(52) U.S. Cl.
CPC .......... *H01L 21/6719* (2013.01); *B65G 47/90* (2013.01)

(58) Field of Classification Search
CPC ........................... F27D 2001/1825; F27D 1/18
USPC ............................................ 432/208; 212/223
See application file for complete search history.

(56) References Cited

U.S. PATENT DOCUMENTS

| 4,226,567 A * | 10/1980 | Van Orsdale, Jr. .. B65H 67/065 414/733 |
| 4,738,618 A * | 4/1988 | Massey ............. H01L 21/67109 414/940 |
| 9,991,139 B2 | 6/2018 | Oosterlaken et al. |
| 11,087,997 B2 | 8/2021 | Oosterlaken et al. |
| 2006/0060137 A1 | 3/2006 | Hasper et al. |
| 2015/0110586 A1* | 4/2015 | Hudgens ................... B66C 9/00 414/800 |
| 2018/0335620 A1 | 11/2018 | Schmieder |
| 2019/0006214 A1 | 1/2019 | Li et al. |
| 2020/0135512 A1 | 4/2020 | Oosterlaken et al. |

FOREIGN PATENT DOCUMENTS

| JP | S62269317 A | 11/1987 |
| JP | H08115908 A | 5/1996 |
| JP | H113862 A | 1/1999 |
| JP | 2006210767 A | 8/2006 |
| KR | 20150024208 A | 3/2015 |

* cited by examiner

*Primary Examiner* — Ronald P Jarrett
(74) *Attorney, Agent, or Firm* — Snell & Wilmer L.L.P.

(57) ABSTRACT

The disclosure relates to a substrate processing apparatus for processing a plurality of substrates. The apparatus comprising a reactor mounted in the apparatus and configured for processing substrates and a reactor mover for moving the reactor for maintenance. The reactor mover is constructed and arranged with a lift to move the reactor to a lower height to allow for access to the reactor by a maintenance worker.

21 Claims, 8 Drawing Sheets

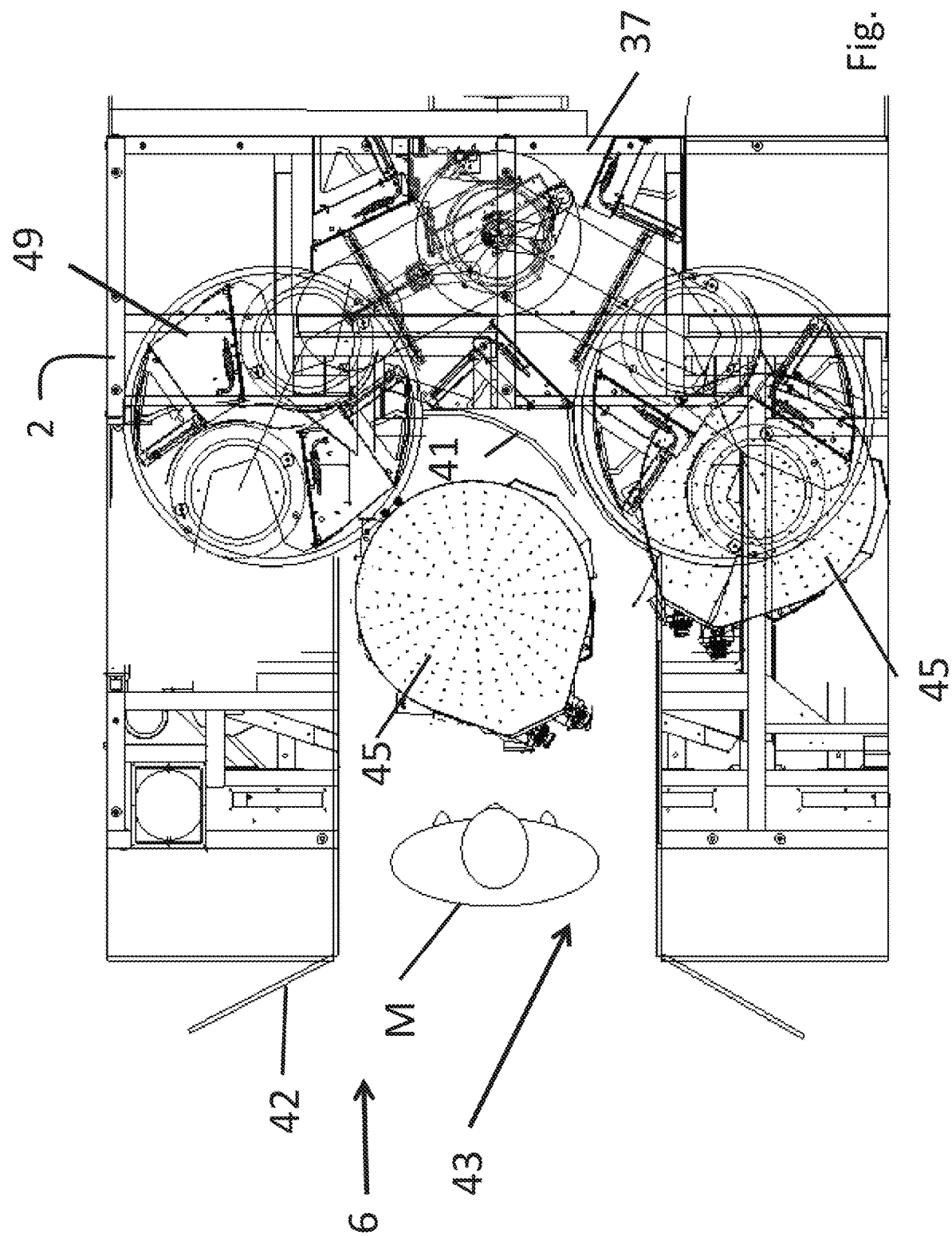

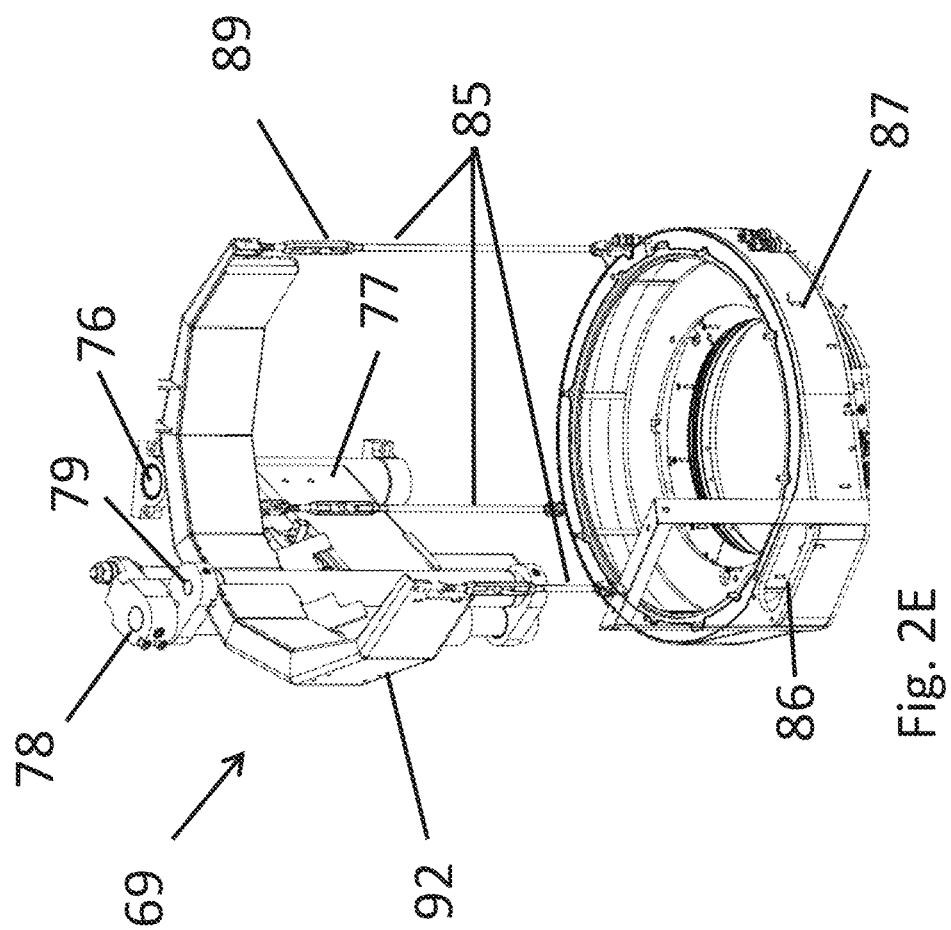

SUBSTRATE PROCESSING APPARATUS, REACTOR MOVER FOR MOVING A REACTOR OF THE APPARATUS AND METHOD OF MAINTAINING THE REACTOR OF THE APPARATUS

CROSS-REFERENCE TO RELATED APPLICATIONS

This application claims priority to U.S. Provisional Patent Application Ser. No. 63/035,208 filed Jun. 5, 2020 titled "SUBSTRATE PROCESSING APPARATUS, REACTOR MOVER FOR MOVING A REACTOR OF THE APPARATUS AND METHOD OF MAINTAINING THE REACTOR OF THE APPARATUS," the disclosure of which is hereby incorporated by reference in its entirety.

FIELD

The present disclosure generally relates to a substrate processing apparatus for processing a plurality of substrates. More particularly, the disclosure relates to a substrate processing apparatus for processing a plurality of substrates, comprising: a reactor mounted in the apparatus and configured for processing substrates and a reactor mover for moving the reactor for maintenance.

BACKGROUND

For feeding cassettes which accommodate a plurality of substrates to the substrate processing apparatus a cassette handler may transfer substrate cassettes between a cassette in-out port, a substrate transfer position and/or a storage device. The storage device may comprise a cassette storage carousel for storing a plurality of cassettes. The substrate handling robot may be constructed and arranged to transfer substrates between a cassette at the substrate transfer position and a substrate rack in a lower region of the apparatus.

The lower region may, optionally, be provided with a rack conveyor which may include a carousel or rotatable arm on which the rack may be positioned. By rotating the carousel or rotatable arm, the rack may be brought from an unloading and/or loading position to a treatment position under the first or second reactor.

An elevator may be provided in the lower region to lift the rack with substrates into the reactor or to lower a rack with processed substrates from the reactor. During treatment in the reactor, the rack and the substrates accommodated therein may be raised in temperature. With the lift, the carousel or rotatable arm, a substrate rack may be removed from the reactor to cool down after treatment.

Substrate processing apparatus may have a reactor that may require maintenance. For example, the reactor may comprise components like an insulation material, a heating element, a temperature sensor, a tube, a liner, an injector, an exhaust, a flange, a rack, and/or a pedestal that may get contaminated, broken or just simply needs to be altered during maintenance. Since these components may be very heavy and mounted in the apparatus at a substantial height within the apparatus, they may not be easily accessible for maintenance by a maintenance worker.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

According to an objective it may be desirable to provide an apparatus which may be easier to maintain by a maintenance worker.

Accordingly, there may be provided a substrate processing apparatus for processing a plurality of substrates, comprising:
 a reactor mounted in the apparatus and configured for processing substrates; and,
 a reactor mover for moving the reactor for maintenance. The reactor mover may be constructed and arranged with a lift to move the reactor to a lower height to allow for access to the reactor by a maintenance worker.

According to a further embodiment, there may be provided a reactor mover for moving a reactor of a substrate processing apparatus for maintenance, wherein the reactor mover comprises a lift and a displacer constructed and arranged to:
 move the reactor to a maintenance area outside the apparatus with the displacer; and,
 lower the reactor in the maintenance area outside the housing with the lift.

According to a further embodiment, there may be provided a method of maintaining a reactor a substrate processing apparatus by:
 moving the reactor to a maintenance area outside the apparatus with a displacer;
 lowering the reactor in the maintenance area outside the housing with the lift; and,
 providing maintenance on the reactor.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

FIG. 2B shows a schematic top view of a portion of the substrate processing apparatus of FIG. 1 during replacement of a reactor.

FIG. 2E shows a perspective side view on reactor mover for moving the reactor for maintenance according to an embodiment.

DETAILED DESCRIPTION OF THE FIGURES

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "substrate" or "wafer" may refer to any underlying material or materials that may be used, or upon which, a device, a circuit, or a film may be formed. The term "semiconductor device structure" may refer to any portion of a processed, or partially processed, semiconductor structure that is, includes, or defines at least a portion of an active or passive component of a semiconductor device to be formed on or in a semiconductor substrate. For example, semiconductor device structures may include, active and passive components of integrated circuits, such as, for example, transistors, memory elements, transducers, capacitors, resistors, conductive lines, conductive vias, and conductive contact pads.

Figure 1:
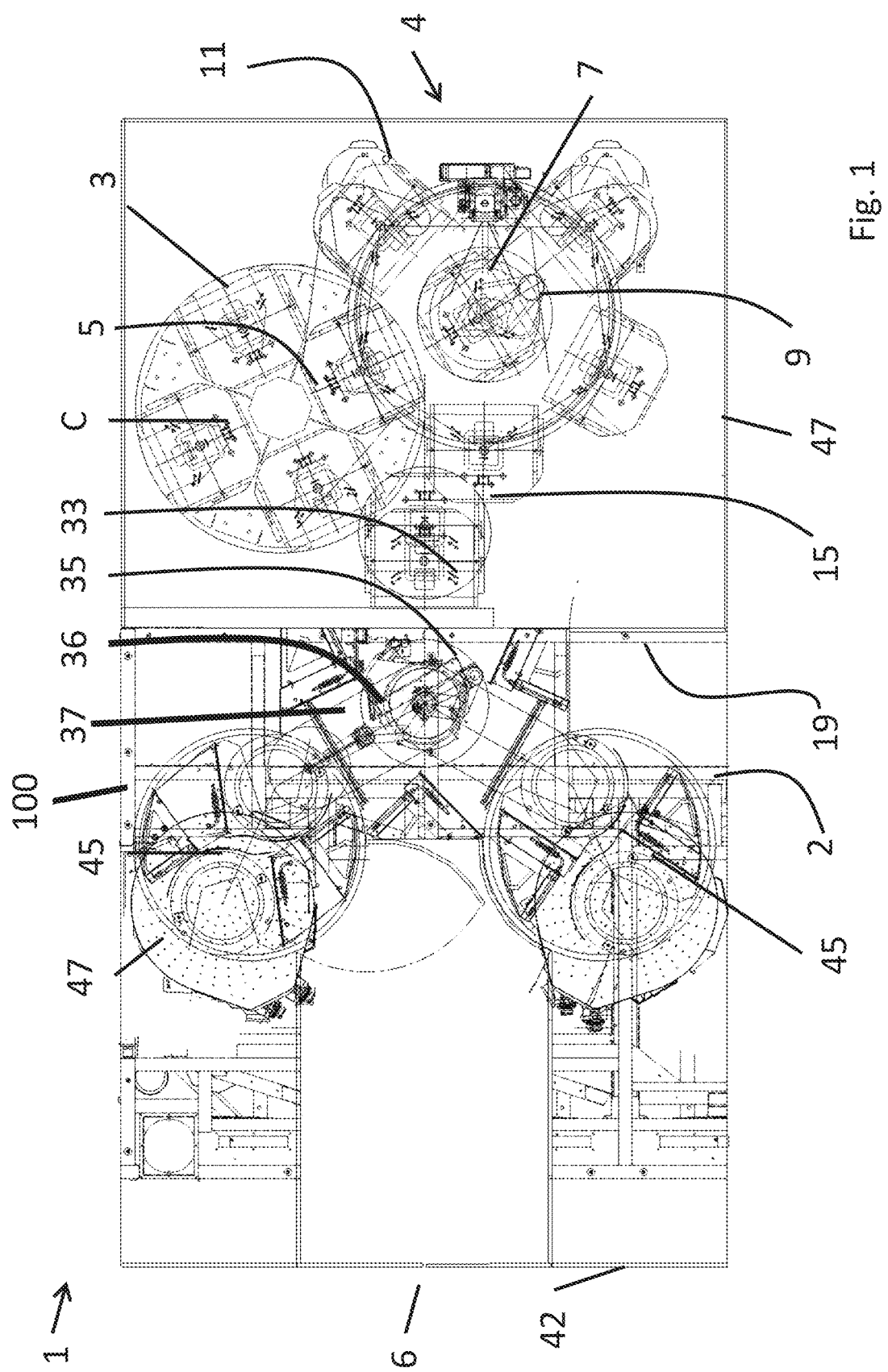
FIG. 1 shows a schematic top view of an example of the substrate processing apparatus according to an embodiment.

FIG. 1 shows a schematic top view of an example of the substrate processing apparatus 1 according to an embodiment. The substrate processing apparatus 1 comprises a housing 2 with a front wall 4 and a back wall 6.

The substrate processing apparatus 1 may comprise a storage device such as a cassette storage carousel 3 for storing a plurality of wafer cassettes C which wafer cassettes each accommodate a plurality of substrates. The cassette storage carousel 3 may comprise a number of platform stages for supporting cassettes. The platform stages may be connected to a central support which is mounted rotatable around a vertical axis 5. Each platform stage may be configured for accommodating a number of cassettes C. A drive assembly may be operatively connected to the central support for rotating the central support with the platform stages around the vertical axis 5.

The substrate processing apparatus 1 may have a cassette handler 7 having a cassette handler arm 9 configured to transfer cassettes C between the cassette storage carousel 3, a cassette in-out port 11 adjacent the front wall 4 of the housing 2 of the substrate processing apparatus 1, and/or a substrate transfer position 15. The cassette handler 7 may comprise an elevating mechanism to reach to the cassettes at different height. Each platform stage for storing cassettes may have a cut-out therein the cut-out sized and shaped to allow the cassette handler arm 9 to pass vertically there through and to allow the platform stage to support a cassette C thereon.

An internal wall 19 separating the cassette handler 7 and the substrate handling robot 35 may be provided. The wall may have a closable substrate access opening 33 adjacent the substrate transfer position 15 which may be constructed and arranged to also open the cassette. More information with respect to the closeable substrate access opening 33 for opening cassettes may be gleaned from U.S. Pat. No. 6,481,945, which is incorporated herein by reference. The substrate transfer position 15 may be provided with a cassette turntable to turn the cassette C and/or to press it against the closeable substrate access opening 33.

The substrate processing apparatus may comprise a substrate handling robot 35 provided with a substrate handling arm 36 to transfer substrates from a cassette C positioned on the substrate transfer position 15 through the closeable substrate access opening 33 to a substrate rack and vice versa. The substrate processing apparatus may comprise a substrate handling chamber 37 in which the substrate handling robot 35 is accommodated.

The housing 2 may have a first and second side wall 47 extending over the full length of the substrate processing apparatus 1. The distance between the sidewalls 47 of the substrate processing apparatus which may define the width of the apparatus may be between 190 and 250 cm, preferably between 210 and 230 cm and most preferably around 220 cm. Maintenance of the substrate processing apparatus 1 may be performed from the backside 6 or front side 4 of the substrate processing apparatus so that there may be no need for doors in the sidewalls 47.

With the construction of the sidewalls 47 without doors multiple substrate processing apparatus 1 may be positioned side by side in a semiconductor fabrication plant. The sidewall of adjacent substrate processing apparatus may thereby be positioned very close together, or even against each other. Advantageously, the multiple substrate processing apparatus may form a wall with the front side 4 of the substrate processing apparatus 1 interfacing with a cassette transport device in a very clean environment of a so called "clean room" having very strict requirements for particles. The backside 6 of the substrate processing apparatus 1 may interface with a maintenance alley which may have less strict requirements for particles than the front side 4.

The substrate processing apparatus 1 may be provided with a first and a second reactor 45 for processing a plurality of substrates. Using two reactors may improve the productivity of the substrate processing apparatus 1. The reactor 45 may comprise components like an insulation material, a heating element, a temperature sensor, a tube, a liner, an injector, an exhaust, a flange, a rack, and/or a pedestal.

The substrate processing apparatus in top view may be configured in a substantial U-shape. The first and second reactors 45 may be constructed and arranged in the legs. The first and second reactors 45 may be provided in the lower part of the legs of the U-shape.

A maintenance area 43 may be constructed and arranged between the legs of the U-shape. The distance between the two legs of the U-shape may be between 60 and 120 cm, more preferably between 80 and 100 cm, and most preferably around 90 cm to allow enough space for a maintenance worker. A back door 42 may be provided between the legs of the U-shape to close off the maintenance area 43 when not in use. The substantial U-shape may include a V-shape as well.

Figure 2A:
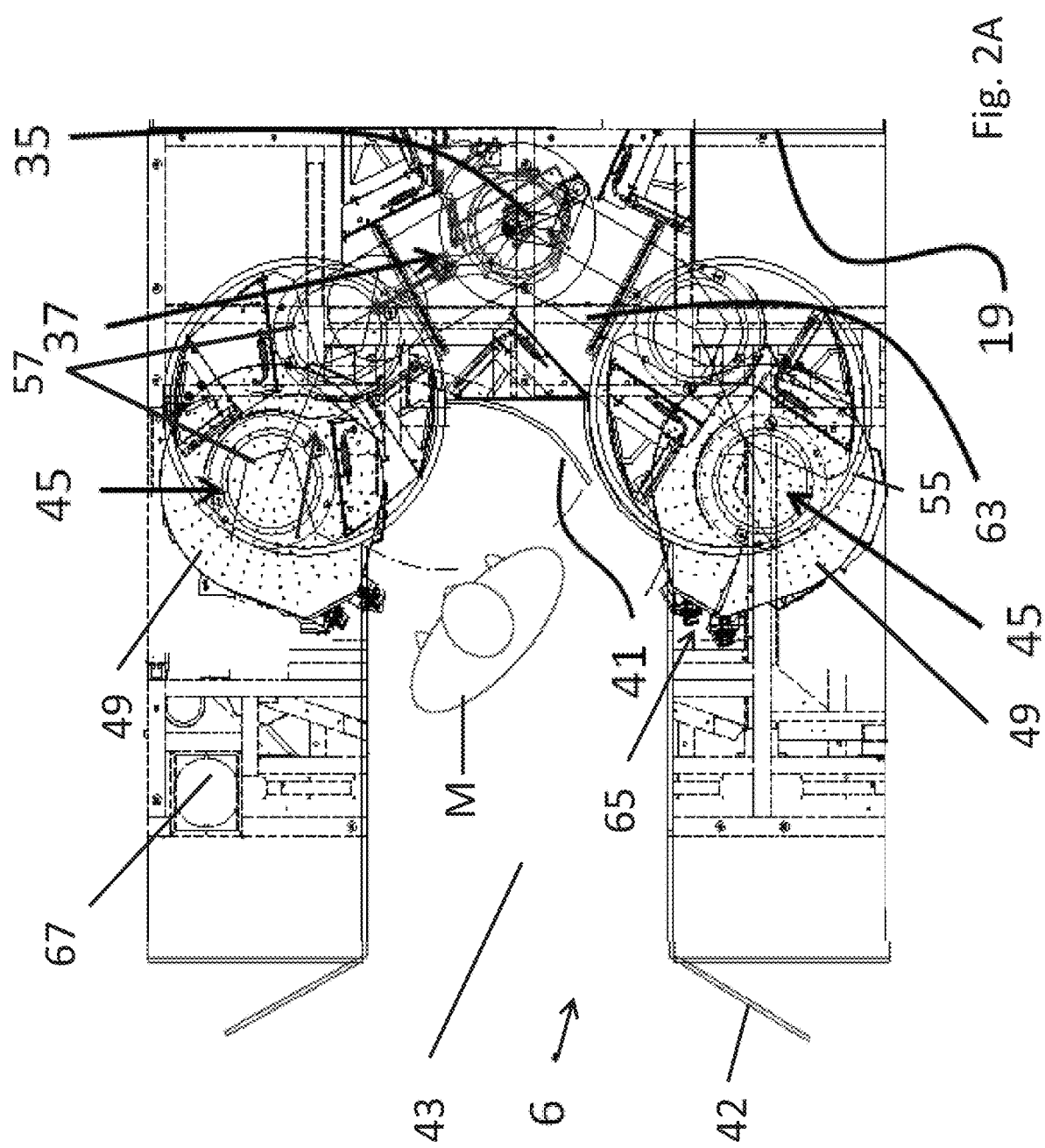
FIG. 2A shows a schematic top view of a portion of the substrate processing apparatus of FIG. 1 during maintenance to a reactor.

FIG. 2A shows a schematic top view of a back portion of the substrate processing apparatus of FIG. 1 during maintenance with the back doors 42 opened. The apparatus may be constructed and arranged to allow maintenance of the reactors 45 from the maintenance area 43 to both the first and second reactor by a maintenance worker M. For example, for maintenance on heating elements, heating sensors, and/or processing gas interfaces 65 (outlets and/or inlets) by the maintenance worker M. The two reactors 45 may be constructed and arranged adjacent to the same maintenance area 43 to allow maintenance of both reactors 45 from the same maintenance area 43. A reactor door 41 may be opened to allow maintenance of the reactor 45.

A maintenance worker M therefore may not enter the housing 2 of the substrate processing apparatus 1 for maintenance work on the reactor 45. Risk of injury of the maintenance worker M and/or contamination of the lower region and/or the reactor 45 may therefore be minimized. Maintenance from outside the housing may also improve the speed and/or accuracy of the maintenance. By using the same maintenance area for both reactors 45 the total footprint of the apparatus may be reduced.

The reactors 45 may be provided in a treatment module 49 which also may include the lower region of the substrate processing apparatus 1 provided with an elevator configured to transfer a rack or boat with substrates between the lower region and the reactor 45. The elevator may be constructed and arranged in the legs of the U-shape as well. A gate valve 63 may be provided between the substrate handler 35 and the lower region of the treatment modules 49 creating a mini environment in the lower region.

A rack conveyor 55 for conveying the rack may be provided in the lower region of the substrate processing apparatus. The rack conveyor 55 may comprise two accommodations 57 for racks. Alternatively, the rack conveyor may comprise three or four accommodations for racks. The rack conveyor 55 may be constructed and arranged in the legs and bottom part of the U-shape. The rack conveyor 55 may be constructed and arranged to horizontally transfer racks between a plurality of rack positions within the lower region.

Accommodation 57 may be a cooling down accommodation for cooling down a rack with just processed hot substrates. The cooling down accommodation may be provided with a gas inlet and outlet. The gas inlet and outlet may be fluidly connected to a pump to create a gas flow through the mini environment in the lower region.

The module 49 may be provided with an elevator configured to transfer a rack with substrates between a lower region of the substrate processing apparatus and the reactor 45. The elevator may comprise a rack support arm having a bearing surface configured to support a substrate rack. The rack conveyor 55 may have a support platform having a cut-out therein. The cut-outs may be sized and shaped to allow the bearing surface of the rack support arm to translate vertically there through and to allow the platform to support a substrate rack. The rack conveyers 55 may be rotatable to transport the rack horizontally from a position close to the substrate handling robot 35 to a position underneath the reactor 45.

The treatment module 49 may be provided with a reactor door 41 openable in a direction of the maintenance area 43. Both treatment modules 49 may be provided with a separate reactor door 41 to allow maintenance of each reactor 55 from the same maintenance area 43 by the maintenance worker M. The reactor door 41 of the treatment module 49 may also allow maintenance of the lower region of the substrate processing apparatus from the same maintenance area 43 for maintenance on the rack conveyers 55, gas inlet, gas outlet, gate valves 63 elevator and/or rack.

Alternatively, two reactor doors may be provided per treatment module; a first reactor door for giving access to the reactor 45 and a second reactor door for giving access to the lower region of the substrate processing apparatus. For example, for maintenance on the rack conveyers 55, gas inlet, gas outlet, gate valves 63 elevator and/or rack access to the lower region of the substrate processing apparatus may be required.

A maintenance worker M therefore may not need to enter the housing 2 of the substrate processing apparatus 1 for maintenance work inside the treatment module 49. Risk of injury of the maintenance worker M and/or contamination of the inside of the treatment module may thereby be minimized.

Gate valves 63 may be provided between the substrate handling chamber 37 and the treatment modules 49. The gate valves 63 may be closed during maintenance to the substrate handling robot 35 so that the treatment modules may continue working while maintaining the substrate handling robot 35.

Maintenance on one of the reactors 45 may not interfere with the other one of the reactors 45 since both are constructed as separate units. The gate valves 63 may be closed during maintenance of one reactor so that the other reactor and the substrate handling robot 35 may continue working.

The reactors 45 may have processing gas interfaces 65 (outlets and/or inlets) which may be connected to a gas exhaust pipe or a process gas delivery system. The processing gas interfaces 65 may be provided adjacent the maintenance area 43 so as to make them easily accessible during maintenance.

The process gas delivery system may be provided (partly) in a gas cabinet 67 constructed and arranged to provide process gas to the first and/or second reactor 45. The gas cabinet may be provided near a top of the legs of the U-shape. Providing the gas cabinet near the top of the U-shape provides easy access for maintenance. Further this place provides flexibility if the gas cabinet needs to be adjusted or enlarged since there is space at the back of the apparatus where no critical components as substrate handlers or cassette handlers are present.

The gas exhaust pipe may be constructed and arranged to remove process gas from at least one of the first and the second reactors and may also be provided near a top of the legs of the U-shape. Providing the gas exhaust pipe in the legs of the U-shape provides easy access for maintenance. The gas exhaust pipe may be provided with pumps and scrubbers which may require regular maintenance. Further this place provides flexibility if the gas exhaust pipe needs to be adjusted or extended since there is space at the back of the apparatus where no critical components such as substrate handling robots and/or cassette handlers are present.

FIG. 2B shows a schematic top view of a back portion of the substrate processing apparatus of FIG. 1 during maintenance with the back doors 42 opened. Maintenance to the reactors may include the replacement of large components such as reactors, reactor tubes, substrate racks, heating elements, doors, pumps and/or valves.

A maintenance worker M standing on a maintenance area 43 outside the housing 2 may remove the reactor 45 for example from the apparatus. Such large components including the tooling to transport them safely may require a large maintenance area 43. Since the same maintenance area 43 may be used for both reactors 45 the footprint of the maintenance area 43 may be reduced. The opening at the back side 6 of the apparatus easily allows the transportation of even big components, such as the reactor 45 out of the apparatus.

Figure 2D:
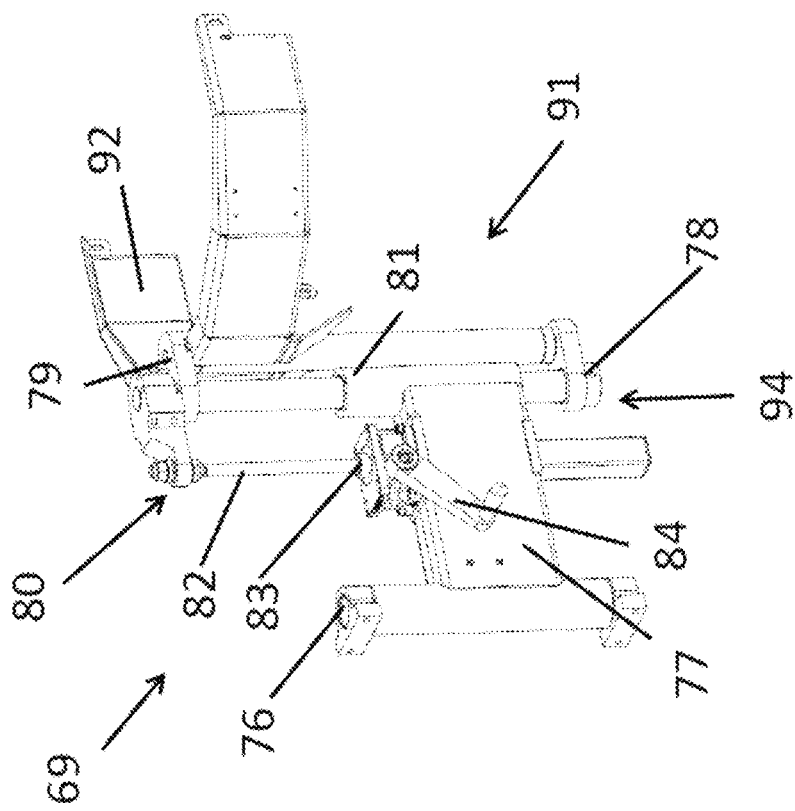
FIG. 2D shows a perspective side view on reactor mover for moving the reactor for maintenance according to an embodiment.
Figure 2C:
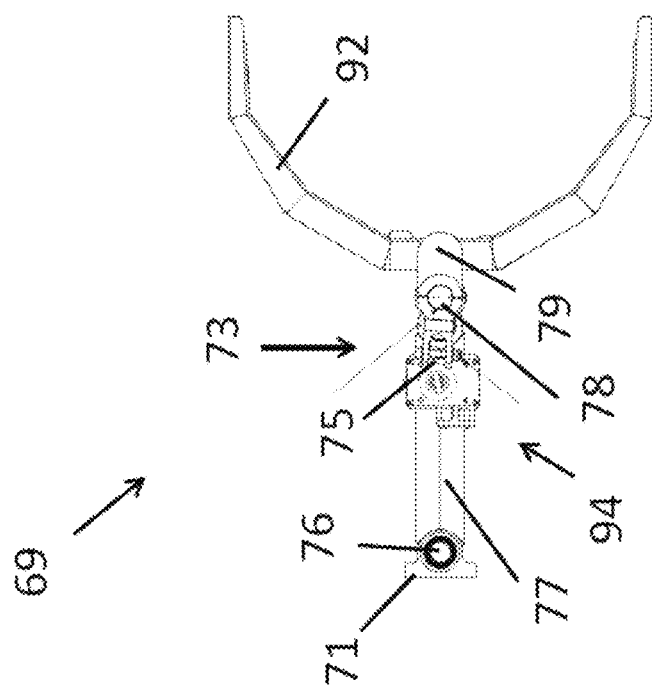
FIG. 2C shows a schematic top view on reactor mover for moving the reactor for maintenance according to an embodiment.

FIG. 2C shows a schematic top view on reactor mover 69 for moving the reactor 45 (in FIGS. 1 and 2A, 2B) for maintenance. The reactor mover 69 may be mounted at a first end 71 to a frame 100 of substrate processing apparatus 1 (in FIG. 1) and at the other via a suspension frame, e.g., C-shape frame 92 to a reactor 45. The C-shape frame 92 may be constructed and arranged to at least partially embrace the reactor 45.

The reactor mover 69 may be constructed and arranged with a displacer 73 to move the reactor 45 in a substantial horizontal direction to a maintenance area 43 (in FIG. 2A). The maintenance area 43 may be outside a housing of the apparatus and the displacer 73 may move the reactor 45 there. The displacer 73 may be provided with a swing mechanism 94.

The swing mechanism 94 may be constructed and arranged to swing the reactor around a substantially vertical axis. The swing mechanism 94 may comprise a first hinge 76 and a swinging arm 77 swingable around the first substantially vertical axis. The swing mechanism 94 may comprise a second hinge 78 and the reactor may be supported by the swinging arm 77 via the second hinge 78 swingable around a second substantially vertical axis. The swing mechanism 94 may comprise a third hinge 79 and the reactor 45 may be supported by the swinging arm 77 via the third hinge swingable around a third substantially vertical axis.

The construction with three hinges 76, 78, 79 and their respective vertical axes makes that the reactor can be moved relatively freely in the horizontal plane so that the reactor can be positioned at the right position on the flange 25. This movement may be accomplished by hand or motor 75 driven.

FIG. 2D shows a perspective side view on reactor mover 69 for moving the reactor 45 (in FIGS. 1 and 2A, 2B) for maintenance. The reactor mover 69 may be constructed and arranged with a lift 80 to move the reactor up and down. The lift 80 may be used to bring the reactor to a lower height to allow for access to the reactor by a maintenance worker.

The lift 80 may be provided as a linear guide mechanism comprising a linear guide 81 in the second hinge 78. The linear guide mechanism may guide the reactor in a substantial vertical direction over a substantially vertical linear guide 81. The C-shape frame 92 may form part of a carriage 91 moveable along the linear guide 81 via the third hinge 79.

The carriage 91 and therefore the C-shape frame 92 may be driven up and down by a threaded pin 82 in a rotatable nut 83. A motor or a crank handle 84 may rotate the rotatable nut 83 via a transmission and move the C-shape frame up and down over the linear guide 81. In this way the lift 80 may be formed in the swing mechanism 94 to move the reactor in a substantial vertical direction in a compact design.

A part of the swinging arm 77 connects the first hinge 76 and the second hinge 78. The lift 80 may be constructed and arranged to move the second hinge 78 relative to the first hinge 76.

The reactor mover 69 may move the reactor up within the housing of the apparatus 1 with the lift 80, may move the reactor to a maintenance area 43 outside the housing of the apparatus 1 with the displacer 73, and, may lower the reactor 45 in the maintenance area 43 outside the housing with the lift 80.

Alternatively, a linear guide mechanism forming part of a displacer may move the reactor in a substantial horizontal direction to a maintenance area over a substantially horizontal linear guide.

The substrate processing apparatus 1 may be provided with two reactors 45 and a single reactor mover 69 may be constructed and arranged to move each reactor 45 to a maintenance area 43. The maintenance area 43 may be the same maintenance area 43 for both reactors 45. The maintenance area may be provided in between the first and second reactor. The apparatus may be provided with two reactor movers 69 each constructed and arranged to move one of the first and second reactor 45 to the maintenance area 43.

FIG. 2E shows a perspective side view on reactor mover 69 for moving the reactor 45 (in FIGS. 1 and 2A, 2B and 2C) for maintenance. The reactor bottom support 87 may be part of the reactor 45 (not shown). The reactor bottom support 87 may support the rest of the reactor 45 sitting on top of it. The reactor bottom support 87 may be provided with an air circulation duct 86.

The reactor mover may be provided with a suspension frame and the reactor 45 may be suspended from the suspension frame with elongated suspensions 85. The reactor bottom support 87 may be suspended from the reactor mover 69 via elongated suspensions 85 during lifting and moving of the reactor 45. More in particular the bottom support 87 may be suspended from the reactor mover 69 via the suspension frame, e.g., C-shape frame 92 and three elongated suspensions 85, which may be a cable or rod. The elongated suspensions 85 may be provided with cable tensioners 89, e.g., turnbuckles to adjust the position of the reactor 45 in the reactor mover during lifting.

The C-shape frame 92 and the three elongated suspensions 85 create room for a substantial part of the reactor 45 to hang there in between. The center of weight of the reactor 45 may be between the suspensions 85. To accomplish that, the C-shape frame may therefore embrace the reactor 45 more than 180 degrees around, for example 200 degrees around. The C-shape frame 92 may still having an opening at the open side of the C-shape frame 92 that allows (portions of) the reactor 45 to move in and be mounted on the bottom support 87. The elongated suspensions may be aligned with a vertical direction. The suspensions 85 may only experience tensile stress.

The three suspensions 85 allow for the reactor 45 to settle itself on a flange 25 when the lift 80 of FIG. 2D lowers the reactor on the flange. The tension on the suspensions 85 may then be released by lowering the C-shape frame 92 with the lift a little further. The suspensions 85 may be connected with flexibility to the C-shape frame 92 and the reactor bottom support 87.

Figure 3B:
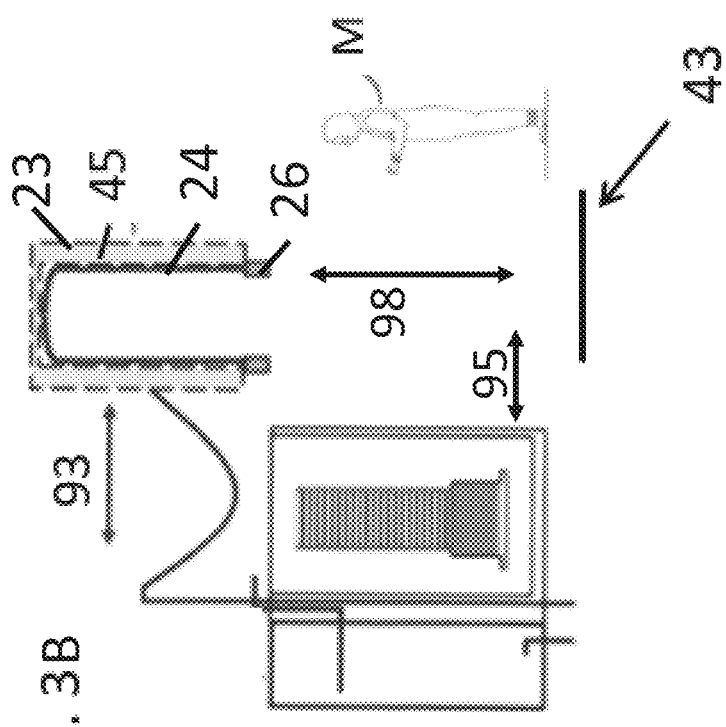
FIGS. 3A and 3B show a side view of a reactor move out of a substrate processing apparatus during maintenance according to an embodiment.
Figure 3A:
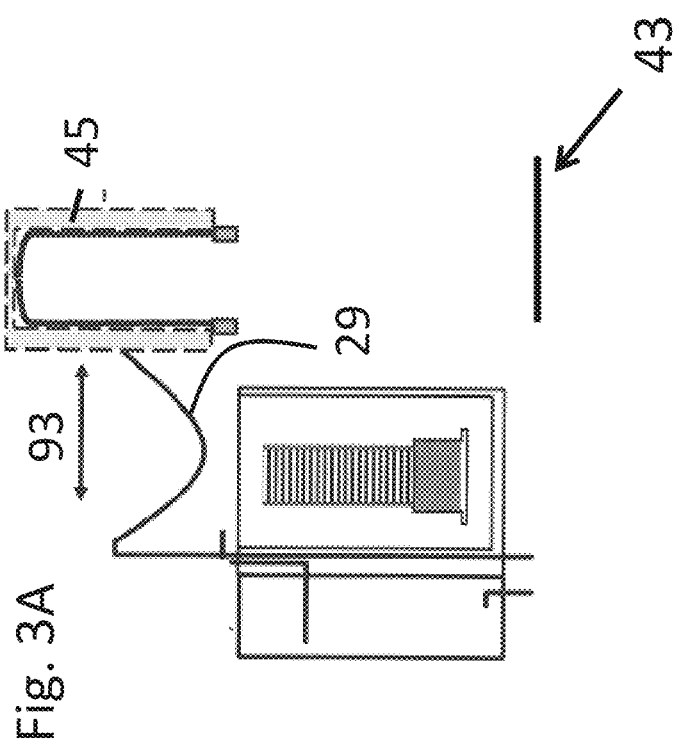

FIGS. 3A and 3B show a side view of a reactor 45 move out of the substrate processing apparatus during maintenance. In FIG. 3A, in step 93, the reactor 45 may be moved away from a position above mini-environment 70 of the lower region into maintenance area 43 so that it can be maintained. This may be done by, for instance, with a reactor mover provided with a lift and displacer. As shown, a utilities cable 29, e.g., for electricity or cooling water may connect the reactor 45 to the rest of the apparatus and may allow for this movement by having an additional length.

The lift may be used to move the reactor 45 to a lower height to allow for access to the reactor by a maintenance worker M as shown in FIG. 3B. The lift may also be used to move the reactor higher before moving it out of the apparatus so as to disengage it from its support. The displacer may comprise a linear guide mechanism or a swing mechanism 94 to move the reactor 45 in a horizontal direction to the maintenance area 43. The maintenance area 43 may be outside the housing of the processing apparatus. A door in the housing may be opened to allow for the reactor 45 to be moved outside the housing.

As shown in FIG. 3B, a maintenance worker M may perform maintenance actions such as removing an insulation material, a heating element 23, a temperature sensor, a tube 24, a flange 26 from the reactor 45. To help the maintenance worker maintain the apparatus, the lift may be used to lower 98 the reactor 45 to a height convenient for maintenance.

The maintenance worker M may remove in 95 a rack 96 from mini-environment 70. It will be clear that for the removal of a rack 96 it may not be necessary that the reactor 45 is in a moved away position but may still be in its processing position above mini-environment 70. For the removal of tube 24 a further tool may be used. It may be clear that not only the tube 24 may be removed but also flange 25 and optionally also heating element 23.

Figure 4:
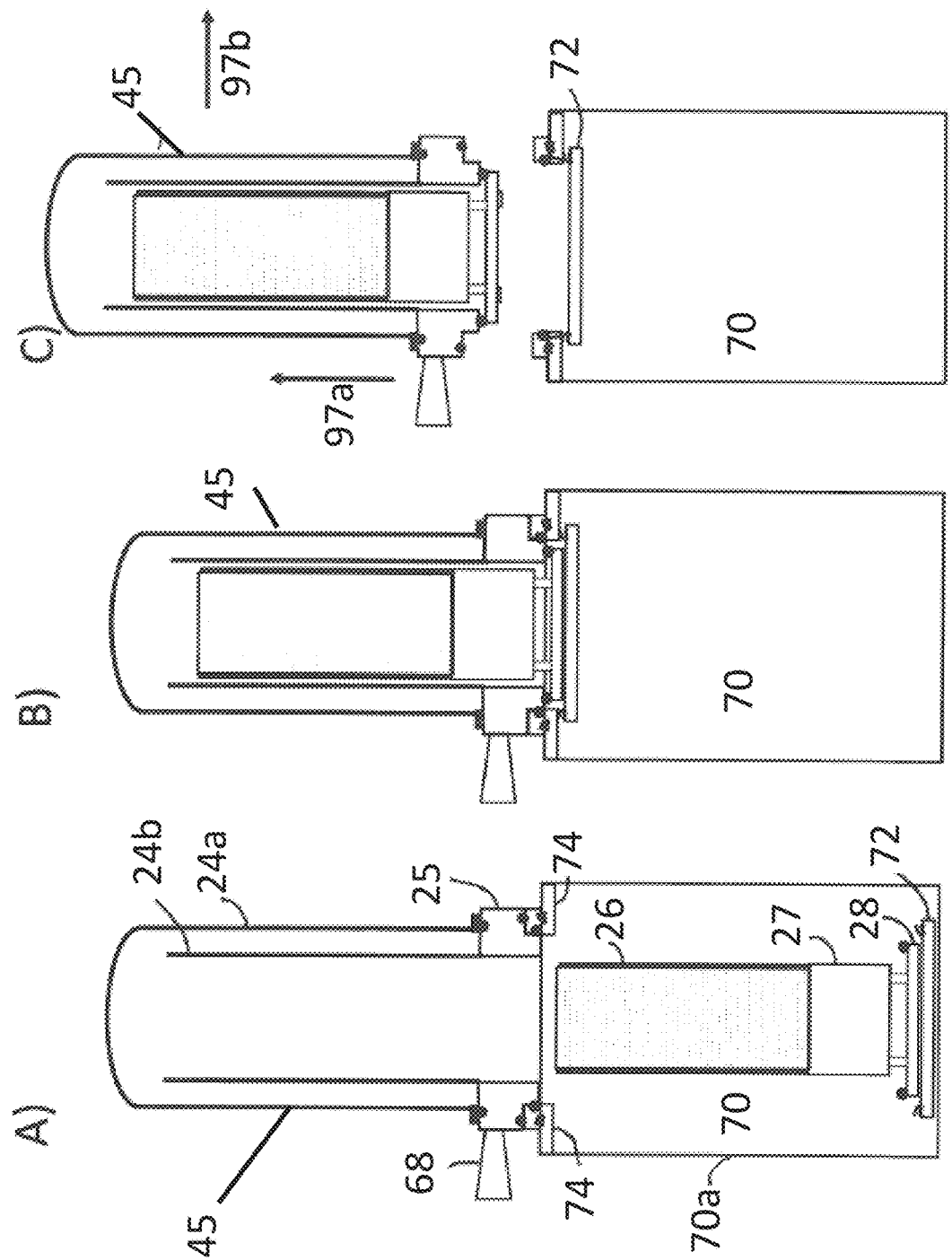
FIGS. 4A, B, and C show a side view of a reactor move out of a substrate processing apparatus during maintenance according to an embodiment.

FIGS. A to C show a side view of a reactor move out of a substrate processing apparatus during maintenance according to an embodiment. FIG. 4 may show in further detail a maintenance operation that may be performed in connection with the system as described in FIGS. 1 to 2.

In FIG. 4 A, the reactor 45 is in process position and is shown for simplicity without heating element 23. In this embodiment, the reactor may be 45 provided with a tube 24a and a liner 24b. The tube 24a and the liner 24b may be supported on one or more flanges 25.

This configuration may be used for low pressure applications wherein the process gases flow in upward direction within inner tube 24a and in downward direction, towards an exhaust in the space between inner process tube 24b and outer process tube 24a. An exhaust 68 may be configured in communication with a vacuum pump for exhausting the process gases.

A rack 26, supported on pedestal 27, door plate 28 and lower plate 72 may be positioned in mini environment 70, enclosed by a housing 70a. An elevator, not shown, may lift the lower plate 72, including door plate 28, pedestal 27 and rack 26 to an uppermost position wherein lower plate 72 seals against a top surface 74 of mini-environment 70 and simultaneously door plate 28 seals against flanges 25, as shown in FIG. 4 B. Further, door plate 28 may be secured against flanges 25 with locking means, not shown.

Then, as shown in FIG. 4 C, the reactor 45 may in its entirety be elevated 97a, optionally after disconnection of gas, vacuum and other tubing and connections, as needed by a lift (not shown). Finally, the reactor 45 may be moved horizontally 97b by a displacer 73 away from a position above mini-environment 70, together with one or more of the flanges 25, tube 24a and liner 24b, exhaust 68, rack 26, pedestal 27 and door plate 28 to allow the performance of maintenance actions. The lift and displacer may be part of the reactor mover. During the removal of the reactor, the mini-environment 70 may be sealed by lower plate 72, while the tube 24 may be sealed by door plate 28, so that contamination during the maintenance operation is avoided.

Moving the reactor 45 with rack 26, pedestal 27 and door plate 28 makes it possible to exchange the rack 26 and the pedestal 27 at a location outside the apparatus. The latter may be advantageously if there may be limited access to the mini environment 70 or if the mini environment preferably is not opened to keep it clean.

Figure 5:
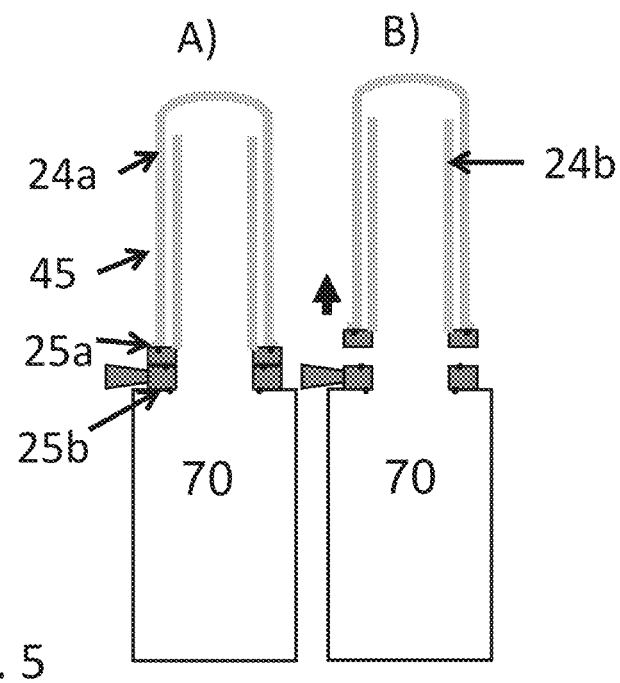
FIGS. 5A and B show a side view of a reactor move out of a substrate processing apparatus during maintenance according to an embodiment.

FIGS. 5 A and B show a side view of a reactor move out of a substrate processing apparatus during maintenance according to an embodiment. In FIG. 5 A, the reactor 45 is in process position and is shown for simplicity without heating element 23. In this embodiment, the reactor is 45 provided with a tube 24a and a liner 24b. The tube 24a and the liner 24b may be supported on one or more flanges 25a, 25b.

As shown in FIG. 5B the reactor 45 may be lifted with a lift (not shown) together with the first flange 25a which may be mounted to tube 24a by a mounting mechanism (not shown). This mounting mechanism may be provided by the maintenance worker or a permanent mount to connect the first flange with the tube may be present. The second flange 25b may remain on the minienvironment 70.

Moving the reactor 45 with first flange 25a may make it possible to exchange the first flange 25a at a location outside the apparatus. Also it may become possible to provide maintenance to components supported on the first flange 25a such as for example the liner 24b and/or an injector (not shown). The second flange 25b may stay in the apparatus on the minienvironments so that the exhaust that is connected to the second flange 25b doesn't need to be disconnected for the removal of the reactor 45.

FIGS. 6A, B, and C show a side view of a reactor move out of a substrate processing apparatus during maintenance according to an embodiment. In FIG. 6A, the reactor 45 is in the process position and is again shown for simplicity without heating element 23. In this embodiment, the reactor 45 provided with a tube 24a and a liner 24b may be also supported on one or more flanges 25a, 25b.

A shown in FIG. 6B the reactor 45 may be lifted by a lift together with both flanges 25a and 25b. A clamp mechanism may be used to clamp one or more flanges to the reactor 45. More specifically the second flange 25b may be clamped to the first flange 25a by clamp 30 functioning as the clamping mechanism. The clamp 30 may for this purpose be provided by the maintenance worker for a move out of the second flange 25b. The clamp 30 may also be permanently installed in the apparatus so that it may be released by a maintenance worker if the first flange 25a is to be moved out separately of the second flange 25b as in FIG. 5.

Figure 6:
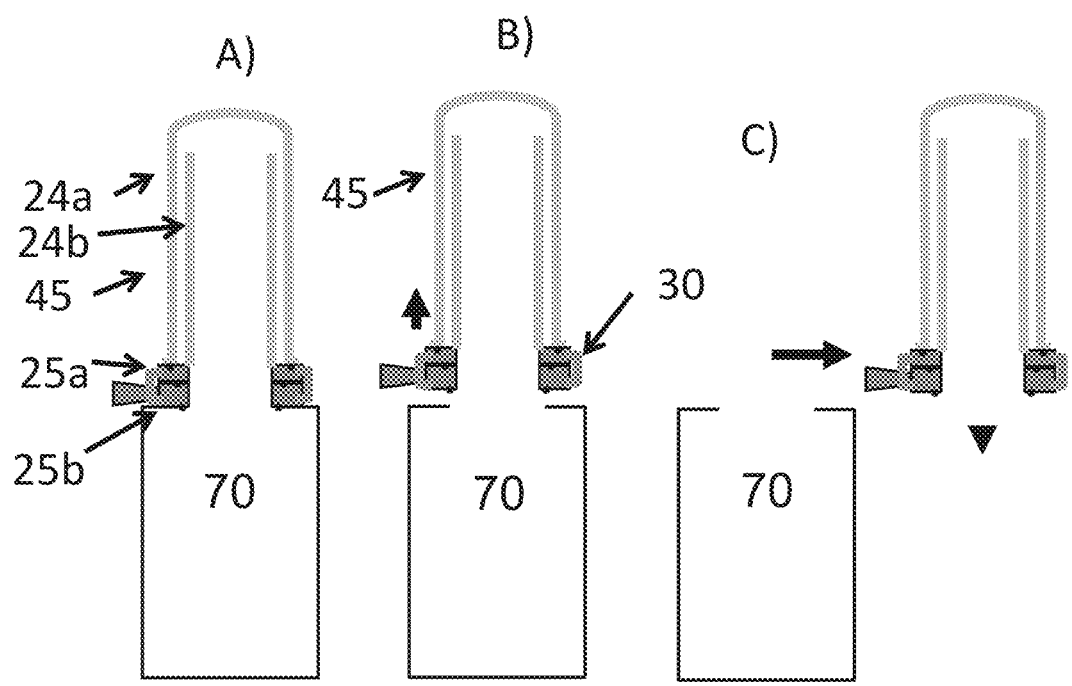
FIGS. 6A, B and C show a side view of a reactor move out of a substrate processing apparatus during maintenance according to an embodiment.

Moving the reactor 45 with the flanges 25a, 25b with a displacer 73, as shown in FIG. 6 C, makes it possible to provide maintenance to the second flange 25b outside the apparatus. For example, the second flange 25b and the exhaust connected thereto may be cleaned or even completely exchanged. The exhaust may need to be disconnected from the rest of the apparatus if the second flange 25b is moved out. The lift and displacer may be part of the reactor mover.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

The invention claimed is:

1. A substrate processing apparatus for processing a plurality of substrates, comprising:
   a frame;
   a reactor mounted to the frame of the apparatus and configured for processing substrates; and,
   a reactor mover for moving the reactor for maintenance, the reactor mover comprising a first end, a first hinge, and a swing mechanism, wherein the swing mechanism comprises a swinging arm, a suspension frame constructed and arranged to at least partially embrace the reactor more than 180 degrees around the reactor, and a lift,
   wherein the first end is configured to mount to the frame of the apparatus,
   wherein the swing mechanism connects to the first end at the first hinge,
   wherein the lift is disposed on the swinging arm, and
   wherein the lift is constructed and arranged to move the reactor to allow for access to the reactor by a maintenance worker, and wherein the lift is constructed and arranged to move the suspension frame relative to the swinging arm.

2. The substrate processing apparatus according to claim 1, wherein the reactor mover is constructed and arranged to move the reactor horizontally to a maintenance area.

3. The substrate processing apparatus according to claim 2, wherein a displacer is constructed and arranged to move the reactor to the maintenance area outside a housing of the apparatus.

4. The substrate processing apparatus according to claim 3, wherein the apparatus is configured with the reactor mover to:
   lift the reactor up within the housing of the apparatus with the lift;
   move the reactor to the maintenance area outside the housing of the apparatus with the displacer; and,
   lower the reactor in the maintenance area outside the housing with the lift.

5. The substrate processing apparatus according to claim 2, wherein the first hinge is constructed and arranged to swing the reactor around a first substantially vertical axis.

6. The substrate processing apparatus according to claim 5, wherein the swing mechanism further comprises a second hinge constructed and arranged to swing the reactor around a second substantially vertical axis.

7. The substrate processing apparatus according to claim 6, wherein the swing mechanism further comprises a third hinge constructed and arranged to swing the reactor around a third substantially vertical axis.

8. The substrate processing apparatus according to claim 6, wherein the swinging arm is connected to the first hinge and the second hinge at opposite ends.

9. The substrate processing apparatus according to claim 1, wherein the lift is constructed and arranged to move the entirety of the suspension frame from a first vertical height to a second vertical height.

10. The substrate processing apparatus according to claim 1, wherein the swing mechanism is constructed and arranged to swing around the first hinge.

11. The substrate processing apparatus according to claim 10, wherein the suspension frame comprises a C-shape.

12. The substrate processing apparatus according to claim 1, wherein the lift is provided with a linear guide mechanism comprising a linear guide, a carriage, a motor or a crank handle to support and move the reactor over the linear guide.

13. The substrate processing apparatus according to claim 12, wherein the linear guide is disposed along a second substantially vertical axis, wherein the first hinge is constructed and arranged to swing the swing mechanism around a first substantially vertical axis, and wherein the second substantially vertical axis is different than the first substantially vertical axis.

14. The substrate processing apparatus according to claim 12, wherein the linear guide mechanism forms part of the lift to move the reactor in a substantial vertical direction over the substantially vertical linear guide.

15. The substrate processing apparatus according to claim 1, wherein the reactor is mounted in the apparatus on a flange and the apparatus is constructed and arranged to clamp the flange to the reactor and the reactor mover is constructed and arranged to move the reactor together with the flange for maintenance.

16. The substrate processing apparatus according to claim 1, wherein the apparatus is provided with a first and second reactor and the reactor mover is constructed and arranged to move the reactor to a maintenance area provided in between the first and second reactor.

17. The substrate processing apparatus according to claim 1, wherein the swinging arm comprises a first swinging arm end and a second swinging arm end opposite the first swinging arm end, wherein the first hinge is connected to the first swinging arm end, and wherein the lift is constructed and arranged to move the suspension frame in a direction perpendicular to a direction between the first swinging arm end and the second swinging arm end.

18. The substrate processing apparatus according to claim 1, wherein the reactor mover comprises a suspension frame connected to a plurality of elongated suspensions, wherein the plurality of elongated suspensions are configured to suspend the reactor from the suspension frame with the plurality of elongated suspensions.

19. The substrate processing apparatus according to claim 18, wherein at least one of the plurality of elongated suspensions is aligned with a vertical direction.

20. A reactor mover for moving a reactor of a substrate processing apparatus for maintenance, wherein the reactor mover comprises a first end configured to mount to a frame of the substrate processing apparatus, a first hinge, and a swing mechanism comprising a swinging arm, a suspension frame, and a lift constructed and arranged to:
   move the reactor to a maintenance area outside the apparatus with a displacer; and,
   lower the reactor in the maintenance area outside the housing with the lift,
   wherein the first hinge connects the first end to the swing mechanism, wherein the swing mechanism is constructed and arranged to swing the swinging arm around the first hinge, wherein the lift is disposed on the swinging arm between the first hinge and the suspension frame, wherein the lift is constructed and arranged to move the suspension frame relative to the swinging arm, and wherein the suspension frame is configured and arranged to at least partially embrace the reactor more than 180 degrees around the reactor.

21. A method of maintaining a reactor of a substrate processing apparatus, the substrate processing apparatus comprising a frame on which the reactor is mounted, by:

connecting a first end of a reactor mover to the frame of the substrate processing apparatus;

connecting the reactor to a second end of the reactor mover, wherein the second end is on an opposite end of an arm of the reactor mover, and wherein the reactor is embraced more than 180 degrees around by the reactor mover;

moving the reactor to a maintenance area outside the apparatus by swinging the reactor mover around a first hinge;

lowering the reactor relative to the arm in the maintenance area outside a housing with a lift, wherein the lift is disposed on the arm between the first hinge and the second end; and, providing maintenance on the reactor.

* * * * *